US 6,528,352 B1

(12) United States Patent
Jackson et al.

(10) Patent No.: US 6,528,352 B1
(45) Date of Patent: Mar. 4, 2003

(54) USE OF CONDUCTIVE ADHESIVE TO FORM TEMPORARY ELECTRICAL CONNECTIONS FOR USE IN TCA (TEMPORARY CHIP ATTACH) APPLICATIONS

(75) Inventors: Raymond A. Jackson, Beacon, NY (US); John U. Knickerbocker, Hopewell Junction, NY (US); Thomas E. Lombardi, Poughkeepsie, NY (US); Amy B. Ostrander, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/981,269

(22) Filed: Oct. 17, 2001

(51) Int. Cl.[7] ................................................ H01L 21/44
(52) U.S. Cl. ..................................................... 438/118
(58) Field of Search ................. 257/738, 777, 257/778; 438/106, 108, 118

(56) References Cited

U.S. PATENT DOCUMENTS 5,468,681 A    11/1995   Pasch
5,529,504 A    6/1996   Greenstein et al.
5,719,438 A    2/1998   Beilstein, Jr. et al.
5,798,469 A    8/1998   Nufer
5,959,356 A *  9/1999   Oh .............................. 257/738
6,139,661 A    10/2000  Cronin et al.
6,396,153 B2 * 5/2002   Fillion et al. ................ 257/774

FOREIGN PATENT DOCUMENTS

JP            6334316           12/1994

* cited by examiner

Primary Examiner—David Nelms
Assistant Examiner—Thao P. Le
(74) Attorney, Agent, or Firm—McGinn & Gibb, PLLC

(57) ABSTRACT

A structure and method for converting a standard ceramic carrier into a temporary chip attach carrier, wherein the device comprises a substrate, a plurality of metal vias interspersed in the substrate, a carrier layer further comprising a cavity dam with a plurality of holes filled with conductive adhesive. The process of forming the temporary chip attach carrier comprises applying a secondary layer further comprising a plurality of holes on a substrate, applying conductive adhesive in the holes, curing the adhesive, placing a chip containing C4 solder bumps onto the secondary layer, applying a force onto the chip, testing and burning-in the secondary layer, removing the force from the chip, separating the chip from the secondary layer, and then re-using the secondary layer.

20 Claims, 2 Drawing Sheets

USE OF CONDUCTIVE ADHESIVE TO FORM TEMPORARY ELECTRICAL CONNECTIONS FOR USE IN TCA (TEMPORARY CHIP ATTACH) APPLICATIONS

BACKGROUND OF THE INVENTION

1. Field of the Invention

The present invention generally relates to semiconductor manufacturing methods and more particularly to temporary electrical connections for use in temporary chip attach applications.

2. Description of the Related Art

In the microelectronics industry, there are Known-Good-Die (KGD) chips, which are chips that have been tested and burned-in, and are known to be good prior to sale. Moreover, it is necessary that chips used to populate a multi-chip module (MCM) be known-good prior to being placed on the MCM, so that it is not necessary to reflow the module excessive times to replace chips that may be defective.

In order to produce KGD chips, one method is to test the die on a ceramic carrier. The carrier can be a standard single-chip substrate. However, the key attribute of the process should be the ability to remove the chip from the carrier without damaging the chip or the solder balls on the chip, so that the chip can then be used in its final application. Conventional methods such as the flip-chip attach is common in the electronics industry, but problems arise when it is necessary to temporarily place a chip on a carrier in order to provide sufficient electrical connectivity to facilitate test and burn-in at elevated temperatures, and then easily remove the chip from the TCA (temporary chip attach) carrier without damage to the chip solder balls.

There have been several ways in which TCA has been accomplished in the past. First, in the "selective plating" process a small nickel bump, 1.4×2 mils, is plated onto a conventional molybdenum via (5 mils diameter). A chip is then placed onto the TCA carrier which has the Ni bumps, and the chip is joined to the carrier by reflowing the solder balls. The solder wets to the Ni, but not to the Mo. The chip is then tested and burned-in. After burn-in, the chip can be removed from the carrier by shearing it off the carrier. Because the interconnection between the substrate and chip is restricted to the small solderable area of the Ni bump, it is possible to shear off the chip without too much damage to the solder balls and chip BLM (Ball-Limiting Metallurgy).

The second process involves the use of the selectively plated carriers described in the first process above, but instead using "hot shear" to shear off the chips after burn-in. Hot shear is conducted at approximately 250° C.–300° C., where the solder is softer, thus imparting less stress to the chip BLM during shear. As with the above process, decreased C4 solder bump pitch, and decreased BLM diameter drives the need for lower removal forces during TCA, or there can be damage to the chip C4 solder ball or BLM.

The third process involves the use of selectively plated carriers as in the first process above, but using a "hot vacuum" to remove the chips. In this process, the solder is allowed to become fully molten and the chip is pulled off the substrate, not sheared off. This imparts less stress to the chip BLM.

A fourth process involves the use of a smaller punched substrate TSM (top surface metallurgy) via, with a highly gritted paste to enable a weaker connection between the chip and substrate without the need for the selective plating process.

In a fifth process, use of a high melt/low melt structure is employed. For instance, a low melt solder of sufficiently low volume is applied to the substrate TSM pad, and then a chip is placed and joined to the substrate by melting the low-melt solder, without melting the higher-melting C4 solder bump. This has advantages in that the solder bump does not have to be fully reflowed, and in order to remove the bump, simply heating above the low-melt temperature is required.

Finally, a sixth process involves the use of a substrate that has been plated in such a manner so as to have dendrites growing on the substrate TSM vias. A chip is then placed on these dendritic vias, and clamped such that the dendrites penetrate the solder bumps, providing electrical contact during burn-in. However, there is a need for a new "temporary chip attach" process, which serves as a low-cost alternative to the above-identified processes.

SUMMARY OF THE INVENTION

In view of the foregoing and other problems, disadvantages, and drawbacks of the conventional KGD processes, the present invention has been devised, and it is an object of the present invention to provide a structure and method for a standard ceramic carrier to be converted into a temporary chip attach carrier by the use of a conductive adhesive material that is applied to the substrate TSM vias.

In order to attain the object suggested above, there is provided, according to one aspect of the invention a structure and process wherein a chip can be placed on the carrier, and clamped down to enable electrical conduction from the chip solder ball, through the conductive adhesive, and to the metallic via on the substrate. The module can then be electrically tested at time-zero, sent through burn-in at elevated temperatures for a given time, and electrically tested during burn-in and post burn-in. When the test and burn-in are completed, the chip can be released from the substrate, and the bond between the conductive adhesive and the substrate will be of proper adhesive quality to remain on the substrate, and not stick to the solder balls on the chip. Thus, the ceramic carrier can be used again with a new chip in need of testing, and the tested chips can be permanently joined to other modules after test, with no contamination on the solder balls.

The advantages of the current invention are numerous. For example, the connection between the conductive adhesive and the solder ball is weak enough to require sufficiently less force to separate the chip from the substrate, but still enable enough electrical connectivity during burn-in.

Moreover, the current invention is simple, and requires less force to remove the chips after burn-in. Also, since the solder balls are never reflowed in the current invention, there are more allowable reflows available for that chip when used on an MCM carrier, etc.

Furthermore, the current invention eliminates the need for the selectively plated TCA carrier altogether, and also offers the least stress on the C4 balls and chip BLM during removal. The selective plating process costs are significant, therefore eliminating it would be a huge savings on TCA carrier costs. Also, the chip reflow is eliminated in the current invention, saving additional TCA processing costs.

The current invention is also advantageous because the solder does not stick well to the conductive adhesive, so the carrier can be reused frequently, etc. Additionally, the advantage of the conductive adhesive is that it accommodates for variations in solder bump and substrate TSM via heights, offering a "cushion". The current invention requires much less force for contact. In this regard, it is noteworthy that the solder balls have an oxide layer on them, and storage of the chips in an N₂ atmosphere minimizes surface oxidation of the solder bumps. In a preferred embodiment, the oxidation could be minimal enough to enable good electrical connection by merely clamping the chip onto the substrate which has conductive adhesive on it. As such, it is unnecessary to have some impingement of the oxide layer on the chip for electrical connectivity. Conversely, if there is a lot of oxidation, then the conductive adhesive can be formulated with silver particles of proper shape, etc., and a proper cure of the material is used such that there are some particles protruding from the adhesive which would act similar to dendrites. Thus, this is another additional benefit of the present novel conductive adhesive concept. However, this aspect is not necessary for the concept to work.

A structure and method for converting a standard ceramic carrier into a temporary chip attach carrier is disclosed, wherein the device comprises a substrate, a plurality of metal vias interspersed in the substrate, a carrier layer further comprising a cavity dam with a plurality of holes filled with conductive adhesive. The process of forming the temporary chip attach carrier comprises having a carrier, applying a ceramic carrier layer or other layer, further comprising a plurality of holes on a substrate, applying conductive adhesive in the holes, curing the adhesive, placing a chip containing C4 solder bumps onto the carrier, applying a force onto the chip, testing and burning-in the carrier, removing the force from the chip, separating the chip from the carrier, and re-using the carrier. Alternatively, the adhesive may be cured after the chip is placed onto the carrier, and no force is applied. Upon separating the chip from the carrier, the solder bumps may be cleaned, and the carrier may be reworked prior to re-using the carrier.

Therefore, the present invention is unique in its use of conductive adhesive to provide electrical contact between the solder bumps of the silicon chip and the metal vias connected to the TCA carrier. In order for contact to occur, a clamping force is used to hold the chip and carrier together. However, this force is relatively small. As shown, the present invention may also be used without a clamping force to hold the TCA structure together with the silicon chip during the test and burn-in procedures. Regardless of whether a clamping force is used, the solder bumps are unaffected during the testing and burning-in of the chip. This allows the TCA carrier to be reused because the solder does not stick to the conductive adhesive.

Furthermore, due to the rather weak connection between the conductive adhesive and the solder ball, a correspondingly small force is required to separate the chip from the carrier after test and burn-in procedures have occurred. Moreover, as indicated above, since the solder balls refrain from reflowing, there are more allowable reflows available for the chip when used in other ways.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF PREFERRED EMBODIMENTS OF THE INVENTION

As mentioned above, there is a need for an improved process for converting a standard ceramic carrier into a temporary chip attach carrier by the use of a conductive adhesive material, which is advantageous over the conventional processes.

One attribute of the current invention is the use of a layer of material on top of a substrate (i.e., this material can be a ceramic material or a glass-based material with holes in it, or a polyimide or dry-film photoresist layer with holes in it). A conductive adhesive fills holes in the layer of material on the substrate (either by screening, injection molding, transfer molding, etc.) and is cured, thus forming a reusable TCA carrier structure.

Thus, the disclosed invention involves the use of a conductive adhesive (e.g., a silver filled thermosetting polymer material of approx. 0.0005 ohm-cm resistivity, but it could also be filled with gold, copper, or other conductive metals, and it could be a thermoplastic material), of proper thickness (ex. 2–3 mils, but could be 1–10 mils thick), and proper modulus (ex. 250 MPa to 5 GPa, but not restricted to these moduli), such that it enables a chip with C4 balls within some finite planarity (ex. 1–2 mils) to make electrical contact with a ceramic carrier with some finite via bulge (ex. 1–2 mils), during test and burn-in (i.e., the conductive material accommodates for some C4 non-planarity and substrate via bulge due to its compliant nature). The conductive adhesive has sufficient adhesion to the ceramic or organic carrier, but has poor adhesion to the solder balls on the chip.

Figure 1:
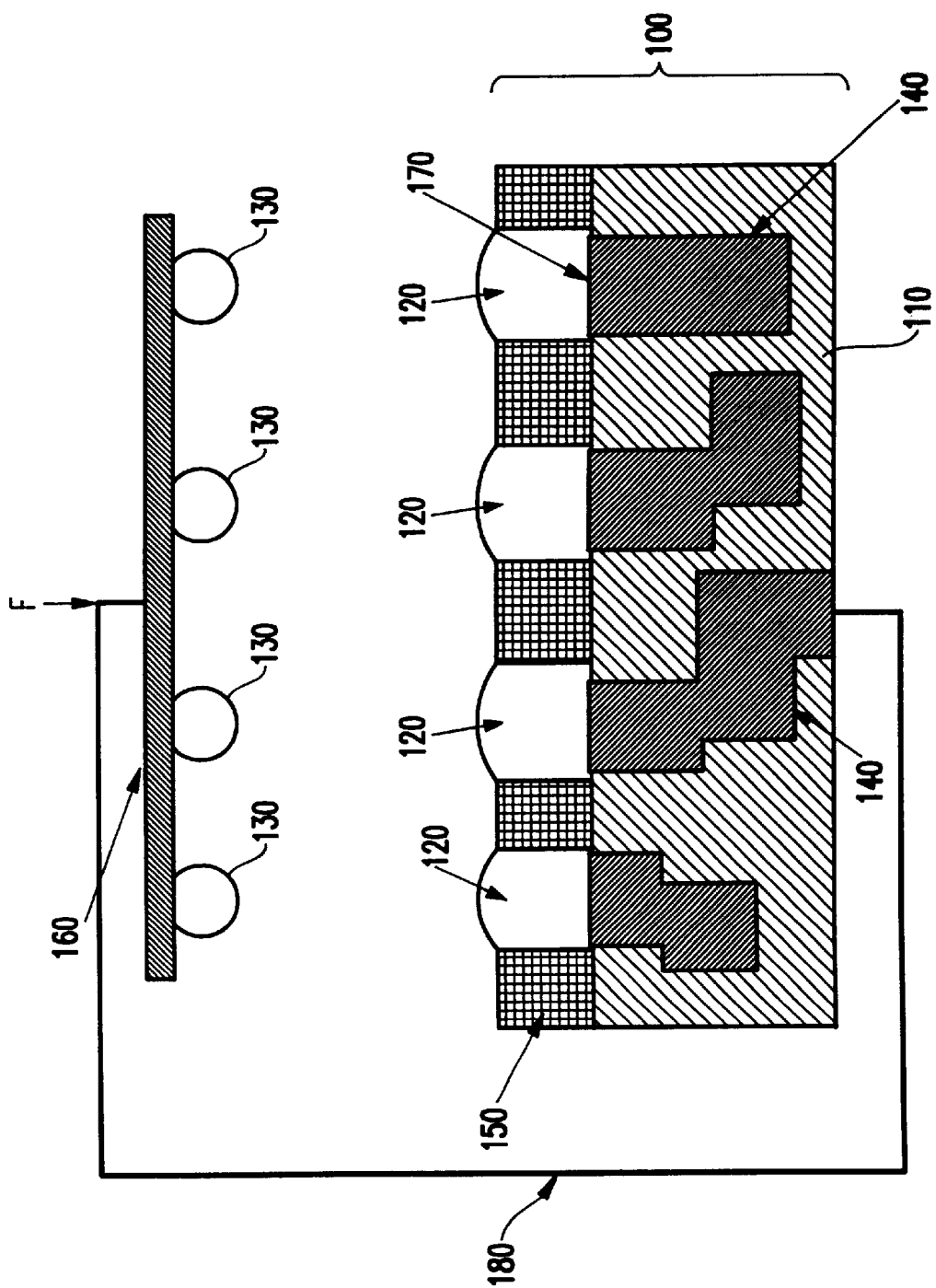
FIG. 1 is a cross-sectional schematic diagram of the temporary chip attach structure according to the present invention.

The disclosed invention can be described more fully by the following embodiments, wherein the structure of invention is best seen in FIG. 1. As illustrated, the entire TCA structure 100 is shown comprising a ceramic or organic substrate 110 with a plurality of internal metal wiring 140 interspersed within the substrate 110. The metal wiring 140 are each capped by a metal via 170, which extends to the upper surface of the substrate 110. The metal vias 170 can be constructed from various materials, such as molybdenum, copper, silver, gold, nickel, etc. Above the substrate 110 is a secondary carrier layer (for example, a ceramic greensheet) 150 comprising a cavity dam with a plurality of holes spaced apart therein. The cavity dam 150 may be a ceramic, polyimide (such as KAPTON®-HV or KAPTON®-VF, available from E. I. Du Pont de Nemours and Company Corporation, Wilmington, Del.), silica, dry-film photoresist (such as RISTON® 4840, available from E. I. Du Pont de Nemours and Company Corporation, Wilmington, Del.), etc. . . . layer, and is attached to the base substrate 110. The plurality of holes spaced apart in the cavity dam 150 are filled with conductive adhesive bumps 120, which connect to the metal vias 170. The conductive adhesive bumps may be comprised with a silver-filled thermosetting polymer (i.e., epoxy, silicone, etc.) with a resistivity of approximately 0.005 ohm-cm. Alternative materials may further comprise gold, copper, aluminum-filled materials, thermoplastic materials, and thermosetting materials (i.e., low modulus urethanes). A silicon chip 160 is then placed onto the TCA structure 100. The underside of the silicon chip 160 comprises a plurality of C4 solder bumps 130, which are adapted to contact the conductive adhesive bumps 120 on the TCA carrier 100. Finally, a clamping force F is shown being applied to the silicon chip 160, wherein a clamp 180 holds the silicon chip 160 and the TCA structure 100 together during testing and burn-in.

Figure 2:
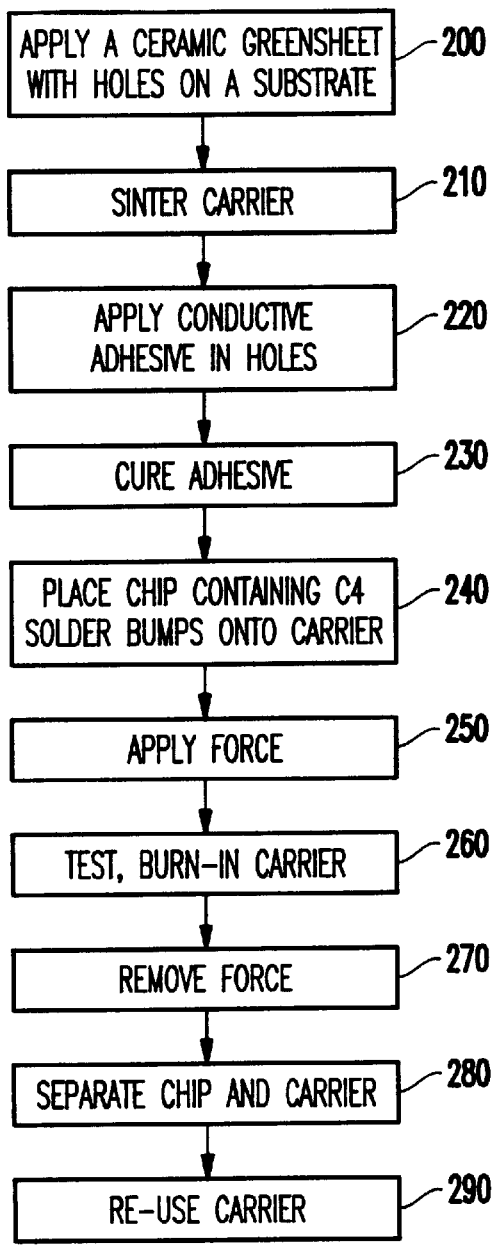
FIG. 2 is a flow diagram illustrating a preferred method of the present invention.

There are several embodiments in which the present invention may be practiced. In a preferred method, as shown in FIG. 2, a ceramic carrier 150 (aluminum oxide with molybdenum or tungsten metallurgy, or a glass-ceramic type carrier with copper or silver metallurgy, etc. . . . ) may be used 200, which has a greensheet 150 which is sintered 210 on top of the package, and which has holes in it (i.e., a "ceramic dam").

To create holes, the secondary layer 150 may be punched like a standard TSM layer, and then the vias can be filled with a sacrificial paste. Then, the sheets may be stacked and laminated together as is done for a standard product. During sintering, the sacrificial material will burn out, leaving the hole pattern on the top surface. Alternately, a non-sintering material may be placed in the via holes, and after sintering, this material may be removed from the vias, leaving holes. Or, holes could be created by lasering holes in the top greensheet post-sintering, in order to get down to the second layer, which has the molybdenum, or copper vias on it.

After sintering, the TCA carrier could go through Ni/Au plating to plate the molybdenum or copper via pads. Then, the holes may be filled by screening 220 conductive adhesive paste 120 into the holes. Here, the hole pattern actually acts as it's own screening mask. After the adhesive is in the holes, it is cured 230, and the resulting structure is a TCA carrier, which now has conductive adhesive paste configured in a specific pattern desired to be on the TSM.

Next, the chip is placed 240 on the carrier, and is clamped down 250 with a clamping force F from a clamp 180 to allow for electrical contact between the chip C4s and the conductive adhesive 120. Now the chip is ready to be tested, burned-in, retested 260, and then released 280 from the TCA carrier when desired. To release the chip, a simple release 270 of the clamp 180 (and clamping force F) is necessary, and then the carrier is ready to be used again 290. The chip C4 solder balls are not damaged during the process, and the carrier with conductive adhesive input/output terminations is ready to be used again. This process only applies for a ceramic substrate. The clamping force F ranges from $9.09 \times 10^{-5}$ lbs. to $4.5 \times 10^{-3}$ lbs., or alternatively, 0.2 grams to 10 grams per C4 solder ball (1.962 N to 98.1 N).

If an organic substrate is used, then the secondary carrier layer cannot be ceramic because the ceramic layer is sintered onto the base ceramic substrate at a high temperature, and if the base substrate were to be an organic material, then it is not possible to put a ceramic layer on top. However, use of a layer of RISTON®, KAPTON®, or polyimide on top (not silica or ceramic) could be employed.

The following processes are used for the various combinations, wherein for a ceramic substrate: (a) A ceramic substrate 110 is used with a ceramic layer on top 150 with a thermoplastic conductive adhesive 120 in the holes of the ceramic layer 150. The adhesive 120 is cured before the chip 160 is clamped down. (b) A ceramic substrate 110 is used with a ceramic layer on top 150 with a thermoplastic conductive adhesive 120 in the holes of the ceramic layer 150. The adhesive 120 is cured after the chip 160 is clamped down. (c) A ceramic substrate 110 is used with a ceramic layer on top 150 with a thermoset conductive adhesive 120 in the holes of the ceramic layer 150. The adhesive 120 is cured before the chip 160 is clamped down. (d) A ceramic substrate 110 is used with a ceramic layer on top 150 with a thermoset conductive adhesive 120 in the holes of the ceramic layer 150. The adhesive 120 is cured after the chip 160 is clamped down.

Alternatively, in processes (e) through (h), the process is identical to (a) through (d), except a silica layer 150 is used instead of a ceramic layer 150. The silica layer 150 can be screened down, spun down, or placed down as a sheet like the ceramic layer, etc.

Alternatively, in processes (i) through (l), the process is identical to (a) through (d), except a KAPTON® layer 150 is used instead of a ceramic layer 150. The KAPTON® layer 150 is stuck down onto the ceramic substrate 110.

Still alternatively, in processes (m) through (p), the process is identical to (a) through (d), except a polyimide layer 150 is used instead of a ceramic layer 150. Yet in another alternative approach, in processes (q) through (t), the process is identical to (a) through (d), except a RISTON® layer 150 is used instead of a ceramic layer 150.

For an organic substrate 110, the above combinations (i) through (l), (m) through (p), and (q) through (t) all apply, except of course an organic substrate 110 is used instead of a ceramic substrate 110. However, for an organic substrate 110, options (a) through (d) and (e) through (h) do not apply.

The advantages of the preferred embodiment are several. First, the conductive adhesive accounts for substrate and C4 non-planarity. Second, the conductive adhesive allows for electrical connection during test and burn-in. Third, after burn-in, the chip and substrate can detach without the need for any "shear" process (i.e., the chip adheres to the substrate metallurgy, and has lower adhesion to the C4 bumps on the chip.) Fourth, a chip join is not required, a flux clean is not required, and a post chip reflow is not required. Fifth, use of a "cavity" material on the substrate TSM acts as a superior "screening mask" to allow the conductive adhesive to be dispensed on top of each substrate via. Moreover, this technique is more conducive to fine pitch applications than standard screening techniques.

The conductive adhesive 120 is a polymer which bonds to a surface on curing, but after curing it is principally inert in the sense that it does not bond to another surface. Thus, when the conductive adhesive 120 is used in the present invention, it bonds to the substrate 10 and to the walls of the holes in the ceramic layer (150), but once it's cured, it doesn't bond to anything else. Therefore, when the chip 160 is placed down onto the structure 100, a clamp 180 is necessary in order to get a good connection between the chip 160 and the conductive adhesive 120. However, in the example (b) above, the conductive adhesive 120 is cured while in contact with the chip solder balls 130, thereby sticking to that surface upon curing, thus a clamp 180 is unnecessary. The result is a relatively weak bond, so it will hold up during test and burn-in, and then when it is desired to remove the chip 160, it can be accomplished without damaging the C4bumps. In order to do this, the conductive adhesive 120 is dissolved. Alternatively, a thermal treatment can be applied to the conductive adhesive 120 to remove it.

Figure 3:
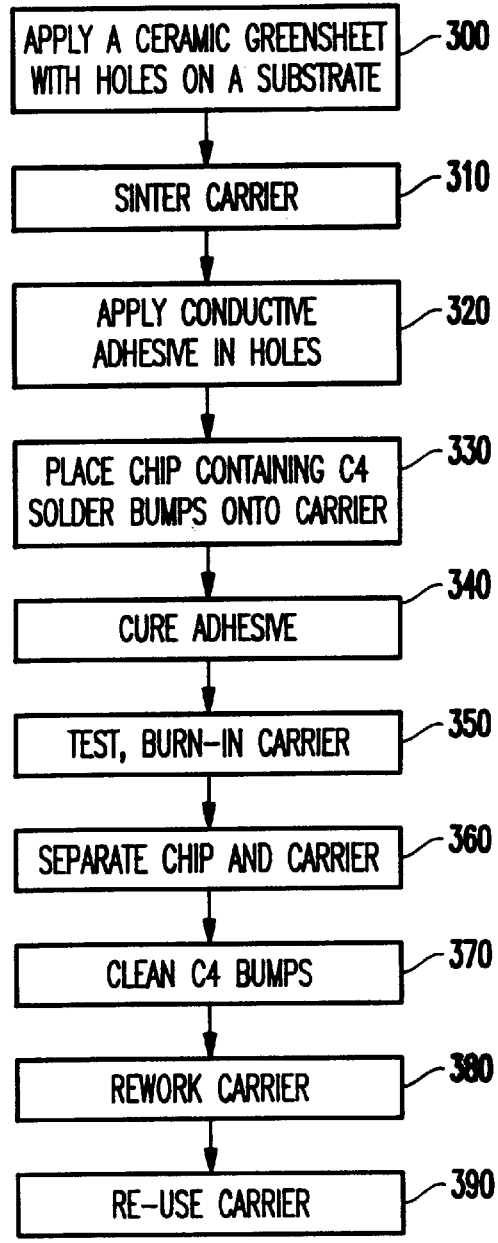
FIG. 3 is a flow diagram illustrating an alternative embodiment of the present invention.

In an alternative embodiment shown in FIG. 3, a similar process is illustrated, whereby a secondary layer 150 with holes is applied 300 on a substrate 110. Then, the carrier 150 is sintered 310. Next, conductive adhesive 120 is applied 320 in the holes. However, a deviation from the process shown and described in FIG. 2 is that in this embodiment, the conductive adhesive is cured 340 after chip 160 is placed onto substrate 330. The approximate temperatures and times to cure the conductive adhesive 120 are very broad. That is, it may be cured at room temperature up to about 200° C., in a matter of minutes, or up to several days (cure takes longer as temperature is lowered). Also, a conductive adhesive 120 that is UV cured, as opposed to thermally cured, is employed so there is much more flexibility here.

Then, the carrier is tested and burned-in 350. After that, the chip and carrier are separated 360 with a predetermined force. Next, the C4 solder bumps undergo a cleaning process 370. Then, the carrier is reworked 380, and finally the carrier may be re-used 390. In this embodiment, the interfacial adhesion between the chip and substrate is good enough for an electrical connection during the test and burn-in step, but it is weak enough to allow for separation after burn-in. The conductive adhesive 120 may be dissolved as previously mentioned. The bond may be weak enough to just pry-off the chip 160, but it is a preferred approach to dissolve the adhesive 120. Moreover, the chip C4 balls 130 are cleaned with IPA (isopropyl alcohol) after burn-in to remove the conductive adhesive 120. Alternatively, another suitable solvent such as xylene, acetone, etc. may be used to remove the adhesive 120.

The advantages of this embodiment are that it eliminates the need for the chip to be clamped, and further eliminates the need for flux cleaning, and reflow with flux after the TCA operation, since the conductive adhesive solution does not require that the chip C4 balls be melted and joined to the TCA carrier. The ceramic dam 150 (or silica, or KAPTON® dam, etc.) must be refilled with conductive adhesive 120 between uses, for the embodiments where the adhesive 120 is cured after it is in contact with the C4 ball 130. Preferably, the conductive adhesive 120 is removed from the holes, additional uncured conductive adhesive 120 is then added, the chip 160 is placed in contact with the new adhesive 120, the structure 100 is cured, the chip 160 is tested and burned-in, the chip 160 is removed (some conductive adhesive 120 is dissolved, or is burnt off somewhat), then the remaining conductive adhesive 120 is removed from the holes in the carrier layer 150, it is cleaned, and reused in the manner described above.

Moreover, there is no clamp required to hold the chip and substrate together during test and burn-in. This conductive adhesive process is a cost reduced approach, as it eliminates the need for the chip C4 bumps to be melted, thus joining the chip to the ceramic carrier for test and burn-in procedures, as well as post burn-in reflow.

After testing, the chip 160 is separated from the structure 100. In the first embodiment, the conductive adhesive 120 is cured in the holes first, and then the chip 160 is placed in contact with the adhesive 120. Next, a force F is applied during testing and burn-in, and upon completion the force F is removed. In the second embodiment, the adhesive 120 is cured when it is in contact with the C4 balls 130. In order to remove the chip 160 from the adhesive 120 after testing and burn-in, the conductive adhesive 120 may be dissolved, as previously indicated, in a solvent, or use of heat to burn off the conductive adhesive 120 may be employed.

As previously indicated, in another alternative embodiment, a KAPTON® sheet 150 is used in place of the ceramic dam layer 150, wherein the KAPTON® sheet is laminated on the TSM of a ceramic carrier or organic carrier, with holes either punched into it, lasered into it, or formed in by a photolithographic process. Then, the cavities are filled with a conductive adhesive, and then the adhesive is cured. Thus, a TCA carrier is ready to be used. This process of using KAPTON® applies equally to a ceramic or organic base substrate. KAPTON® is a thermoplastic polymer. A KAPTON® sheet about 1 to 15 mils thick may be used. The KAPTON® sheet can be placed on the substrate post-sintering (in the case of a ceramic substrate vs. the ceramic dam layer which has to be sintered onto the ceramic substrate), and it can be used for organic packages (where the ceramic dam layer cannot), and it can be removed if necessary. The only way to remove the ceramic dam layer would probably be to lap or grind it off.

Also, as previously mentioned, in still another alternative embodiment, a TCA carrier with a silica layer on the TSM with holes lasered or photoprocessed in it is used. Then, the hole patterns are filled with a conductive adhesive, and then the adhesive is either cured prior to applying the chip or post-chip apply. Now, the TCA carrier is ready to use. The advantages of using silica are that it can be applied to a ceramic carrier post-sinter, unlike the ceramic dam layer, which is sintered onto the carrier. Moreover, it should be apparent to one skilled in the art the advantages and disadvantages of "hard" ceramic and silica dams, vs. "softer" KAPTON® and polyimide dams. Moreover, the ceramic and silica choices are only suitable for use on a ceramic substrate, while the other choices are good for ceramic and organic substrates.

In a fourth embodiment, a ceramic or organic carrier is used with a polyimide layer laminated on the TSM with holes formed in the polyimide by either punch, laser or a photo process. Once the hole pattern is formed, and the polyimide is laminated onto the substrate, the holes can be filled with conductive adhesive, and either before or after curing, the TCA carrier is ready for use. The advantages of this embodiment are that the polyimide layer may be added post-sinter, and it may be used with organic and ceramic materials alike.

In another embodiment, a ceramic or organic carrier is used with a RISTON® layer applied to the TSM with holes lasered or photoprocessed. Next, the holes are filled with conductive adhesive, and before or after curing, the TCA carrier is ready for use. Alternatively, conductive adhesive is screened into the cavity holes of the carrier. The screening process is a relatively easy process. Or, a thermoplastic conductive adhesive is injection molded into the cavity holes. Injection molding is precise and is used for thermoplastic materials. Or, a thermoset conductive adhesive is transfer molded into the cavity holes. Transfer molding is precise and is used for thermoset materials.

Thus, the concept of using a conductive adhesive, either a thermosetting material, or a thermoplastic material that is filled into a via hole pattern on the top of a substrate material (ceramic or organic) is a unique aspect. Moreover, the conductive material has proper electrical and mechanical properties (i.e., it offers a compliant surface which accommodates for some via bulge) to enable a chip C4 cage to be placed in contact with the substrate TSM sufficiently to provide electrical connection during test and burn in, and then simple removal of the chip for re-use after testing is accomplished.

Therefore, the present invention is unique in its use of conductive adhesive to provide electrical contact between the solder bumps of the silicon chip and the metal vias connected to the TCA carrier. In order for contact to occur, a clamping force is used to hold the chip and carrier together. However, this force is relatively small. As shown, the present invention may also be used without a clamping force to hold the TCA structure together with the silicon chip during the test and burn-in procedures. Regardless of whether a clamping force is used, the solder bumps are unaffected during the testing and burning-in of the chip. This allows the ceramic dam to be reused because the solder does not stick to the conductive adhesive if the adhesive is cured before the solder balls are in contact with it. Even if the adhesive is cured after the solder balls come in contact with the adhesive, and there is some stickiness between the balls and the adhesive, it can be easily removed by applying solvent or heat treatment as previously discussed.

Furthermore, due to the rather weak connection between the conductive adhesive and the solder ball, a correspondingly small force is required to separate the chip from the carrier after test and burn-in procedures have occurred. Moreover, since the solder balls refrain from reflowing, there are more allowable reflows available for the chip when used in other ways. Finally, the use of the conductive adhesive in the present invention allows for significant cost savings as a selectively plated TCA carrier is no longer necessary.

While the invention has been described in terms of preferred embodiments, those skilled in the art will recognize that the invention can be practiced with modification within the spirit and scope of the appended claims.

What is claimed is:

1. A method of temporarily attaching a chip to a testing device, said method comprising:

applying a secondary layer onto a substrate, wherein said substrate comprises a plurality of metal vias, wherein said secondary layer comprises a plurality of holes exposing said metal vias;

filling said holes with a conductive adhesive;

curing said condsuctive adhesive;

placing a chip on said secondary layer, wherein said silicon chip further comprises a plurality of solder bumps, wherein said bumps contact said conductive adhesive;

applying a force on said chip to hold said chip against said secondary layer;

testing and burning-in said chip;

removing said force from said chip; and separating said chip from said secondary layer.

2. The method of claim 1 wherein said step of filling said holes with said conductive adhesive is accomplished by one of screening, injection molding, and transfer molding.

3. The method of claim 1, wherein said secondary layer comprises one of ceramic and organic materials.

4. The method of claim 1, wherein said secondary layer comprises one of a silica layer, a polyimide layer, and a dry film photoresist layer.

5. The method of claim 1, wherein said conductive adhesive comprises one of thermoplastic material and thermosetting material.

6. The method of claim 1, wherein said conductive adhesive has a curing temperature below a solder reflow temperature.

7. The method of claim 1, wherein said step of separating said chip from said secondary layer further comprises applying one of a solvent, heat treatment, and shear force to remove said chip from said secondary layer.

8. The method of claim 1, wherein said solder bumps refrain from reflowing.

9. A method of temporarily attaching a chip to a testing device, said method comprising:

applying a secondary layer onto a substrate, wherein said substrate comprises a plurality of metal vias, wherein said secondary layer comprises a plurality of holes exposing said metal vias, filling said holes with a conductive adhesive;

placing a chip on said secondary layer, wherein said silicon chip further comprises a plurality of solder bumps, wherein said bumps contact said conductive adhesive;

curing said adhesive;

testing and buring-in said chip;

separating said chip from said secondary layer;

cleaning said solder bumps; and reworking said secondary layer.

10. The method of claim 9 wherein said step of filling said holes with said conductive adhesive is accomplished by one of screening, injection molding, and transfer molding.

11. The method of claim 8, wherein said secondary layer comprises one of ceramic and organic materials.

12. The method of claim 9, wherein said secondary layer comprises one of a silica layer, a polyimide layer, and a dry film photoresist.

13. The method of claim 9, wherein said conductive adhesive has a curing temperature below a solder reflow temperature.

14. The method of claim 9, wherein said conductive adhesive comprises one of thermoplastic material and thermosetting material.

15. The method of claim 9, wherein said step of separating said chip from said secondary layer further comprises applying one of a solvent, heat treatment, and shear force to remove said chip from said secondary layer.

16. A method of attaching a chip to a test device comprising:

providing a test device having an upper surface having conductive connections;

providing a layer on said upper surface, wherein said layer includes openings corresponding to said conductive connections filled with conductive adhesive; and temporarily attaching said chip to said layer such that electrical connections on said chip contact said conductive adhesive in said openings.

17. The method in claim 11, wherein said layer comprises ceramic.

18. The method in claim 16, wherein said temporarily attaching includes clamping said chip to said test device.

19. The method in claim 16, wherein after said temporarily attaching, said layer is positioned between said chip and said upper surface.

20. The method in claim 16, further comprising testing said chip by sending signals to said chip through said conductive adhesive.

* * * * *